US009348240B2

(12) United States Patent
Huang et al.

(10) Patent No.: US 9,348,240 B2
(45) Date of Patent: May 24, 2016

(54) MASK PATTERN ALIGNMENT METHOD AND SYSTEM

(71) Applicants: Yibin Huang, Shanghai (CN); Winnie Liu, Shanghai (CN)

(72) Inventors: Yibin Huang, Shanghai (CN); Winnie Liu, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 743 days.

(21) Appl. No.: 13/686,096

(22) Filed: Nov. 27, 2012

(65) Prior Publication Data

US 2013/0258306 A1 Oct. 3, 2013

(30) Foreign Application Priority Data

Mar. 31, 2012 (CN) .......................... 2012 1 0101351

(51) Int. Cl.
*G03F 9/00* (2006.01)

(52) U.S. Cl.
CPC ............ *G03F 9/7049* (2013.01); *G03F 9/7003* (2013.01)

(58) Field of Classification Search
CPC ............ G03F 7/70633; G03F 7/70641; G03F 7/70841; G03F 7/70141; G03F 7/70258; G03F 9/7003; G03F 9/7007; G03F 9/7023; G03F 9/7026; G03F 9/7049; G03F 9/7084; G03F 9/7088; G03F 1/42
USPC ..................... 355/52, 53, 55, 72, 77; 356/399
See application file for complete search history.

(56) References Cited

U.S. PATENT DOCUMENTS 5,153,678 A * 10/1992 Ota .............................. 356/401
5,561,606 A * 10/1996 Ota et al. ........................ 716/55
2011/0080570 A1 4/2011 Sunohara

* cited by examiner

*Primary Examiner* — Toan Ton
*Assistant Examiner* — Mona M Sanei
(74) *Attorney, Agent, or Firm* — Anova Law Group, PLLC

(57) ABSTRACT

An alignment method includes dividing a wafer into a plurality of regions including a first region and a second region, and each region contains a plurality chip areas. The method also includes obtaining alignment offset values for the first region, and determining a first alignment compensation equation for the first region. The method also includes obtaining alignment offset values for the second region, and determining a second alignment compensation equation for the second region. Further, the method includes determining whether a chip area to be exposed is in the first region or the second region, when the chip area is in the first region, using the first alignment compensation equation to adjust alignment of the wafer and, when the chip area is in the second region, using the second alignment compensation equation to adjust the alignment of the wafer.

15 Claims, 5 Drawing Sheets

MASK PATTERN ALIGNMENT METHOD AND SYSTEM

CROSS-REFERENCES TO RELATED APPLICATIONS

This application claims the priority of Chinese patent application no. 201210101351.2, filed on Mar. 31, 2012, the entire contents of which are incorporated herein by reference.

FIELD OF THE INVENTION

The present invention relates to the field of semiconductor manufacturing technology and, more particularly, relates to techniques for aligning wafers during the photolithography process.

BACKGROUND

To improve the integration degree of semiconductor devices, currently a semiconductor chip typically includes several layers of semiconductor structures, and the formation process of each layer of semiconductor structure takes at least one or more photolithography processes to form the patterns and doping regions of the semiconductor structure.

To improve the resolution of the photolithography process, existing exposure equipment often includes a stepper or a scanner. The light source of the exposure equipment passes through a projection mask and, after being reduced proportionally, illuminates a part of a wafer. Thus, exposure of the entire wafer requires repeated exposures of several parts of the wafer. Further, because there might be errors overlaying the mask pattern with the wafer in multiple exposures, the mask pattern and the wafer need to be aligned before every exposure of the wafer.

In the existing exposure equipment, to align the projection mask with the wafer, before the exposure process, the offset between the projection mask and the wafer to be exposed is measured at different positions to obtain an alignment model for the entire wafer to be exposed. When a portion of the wafer needs to be exposed, the wafer is aligned using the alignment model such that the projection mask can overlay the exposure portion of the wafer. The wafer can then be exposed using the projection mask.

However, in the lithography process, such alignment model may be unable to completely solve the existing problem that the wafer often cannot be aligned with the projection mask with desired accuracy. Often, certain portions of the wafer may have a high alignment precision, while certain other portions of the wafer may have a low alignment precision. The disclosed methods and systems are directed to solve one or more problems set forth above and other problems.

BRIEF SUMMARY OF THE DISCLOSURE

One aspect of the present disclosure includes a method for aligning a mask with a wafer for exposing the wafer with a mask pattern in the mask. The method includes dividing the wafer into a plurality of regions including a first region and a second region different from the first region, and each region contains a plurality chip areas. The method also includes obtaining alignment offset values for the first region, and determining a first alignment compensation equation for the first region based on the alignment offset values for the first region. The method also includes obtaining alignment offset values for the second region, and determining a second alignment compensation equation for the second region based on the alignment offset values for the second region. Further, the method includes determining whether a chip area to be exposed is in the first region or the second region, when the chip area is in the first region, using the first alignment compensation equation to adjust alignment of the wafer and, when the chip area is in the second region, using the second alignment compensation equation to adjust the alignment of the wafer.

Another aspect of the present disclosure includes an exposure system. The exposure system includes an illumination unit 302 for providing a light source, a mask stage configured to hold at least one mask containing a mask pattern, and a mask stage drive configured to align the mask stage. The exposure system also includes a wafer stage configured to hold at least one wafer, a wafer stage drive configured to align the wafer stage, and an optical projection unit disposed between the mask stage and the wafer stage to expose the mask pattern on the wafer. Further, the exposure system includes a controller, and the controller is configured to divide the wafer into a plurality of regions including a first region and a second region different from the first region, each region containing a plurality chip areas, to obtain alignment offset values for the first region, and to determine a first alignment compensation equation for the first region based on the alignment offset values for the first region. The controller is also configured to obtain alignment offset values for the second region, and to determine a second alignment compensation equation for the second region based on the alignment offset values for the second region. Further, the controller is configured to determine whether a chip area to be exposed is in the first region or the second region, to use the first alignment compensation equation to control at least one of the wafer stage drive and the mask stage drive to adjust alignment of the wafer with the mask when the chip area is in the first region, and to use the second alignment compensation equation to control at least one of the wafer stage drive and the mask stage drive to adjust the alignment of the wafer with the mask when the chip area is in the second region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
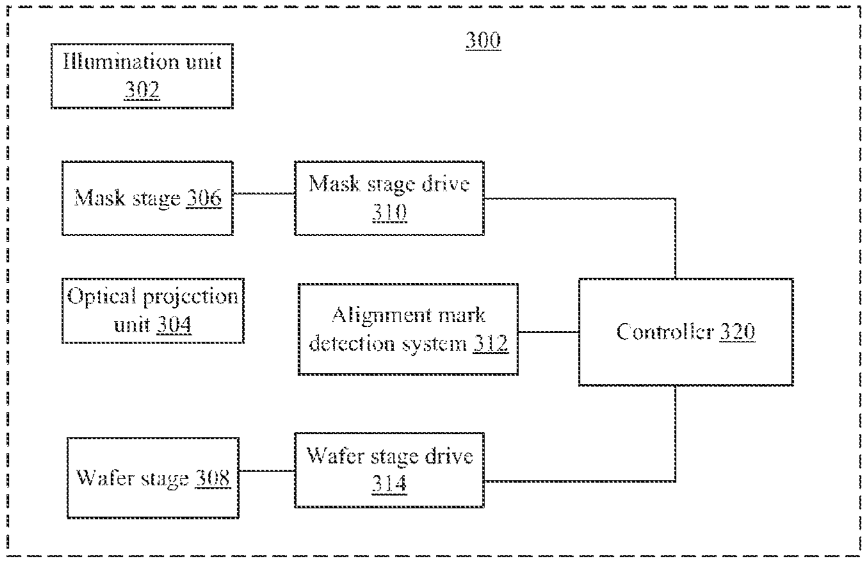
FIG. 1 illustrates an exemplary exposure system consistent with the disclosed embodiments.

FIG. 1 illustrates a block diagram of an exemplary exposure system 300 consistent with the disclosed embodiments. Exposure system 300 may include any appropriate lithographic exposure system, such as a stepper or a scanner. As shown in FIG. 1, exposure system 300 includes an illumination unit 302, an optical projection unit 304, a mask stage 306, a wafer stage 308, a mask stage drive 310, an alignment mark detection system 312, a wafer stage drive 314, and a controller 320. Certain components may be omitted and other components may be included.

The illumination unit 302 may provide a light source to be used by the exposure system 300 to expose wafers coated with photoresist or other photolithographic materials. The wafer stage 308 is configured to hold one or more wafers to be exposed, and the wafer stage drive 314 is configured to adjust the position of the wafer stage 308 for alignment of the wafer. Further, the mask stage 306 may be configured to load at least one mask or reticle. The mask or reticle may contain a mask pattern corresponding to the pattern of the circuitry for one or more chips on the wafer. In certain embodiments, the reticle may be a plate of transparent quartz. Similarly, the mask stage drive 310 is configured to adjust the position of the mask stage 306 for alignment of the reticle or mask.

The optical projection unit 304 may be disposed between the mask stage 306 and the wafer stage 308. The light from the illumination unit 302 passes through the reticle on the mask stage 306 to form an image of the reticle pattern. The image of the reticle pattern is then focused and reduced by the optical projection unit 304 (e.g., a lens), and projected onto a wafer to be exposed on the wafer stage 308, such that the photoresist or other material on the surface of the wafer is exposed with the reticle pattern.

Further, alignment mark detection system 312 may be configured to detect whether an alignment mark on the wafer (e.g., between chip areas) is aligned with an alignment mark on the reticle or mask. More particularly, alignment mark detection system 312 may detect an offset between the alignment mark on the wafer and the alignment mark on the reticle, and may determine whether the alignment mark on the wafer and the alignment mark are aligned based on the offset.

The controller 320 may provide control functions for the exposure system 300. For example, the controller 320 may determine various control parameters based the alignment offset using a predetermined algorithm, and may use the various control parameters to control the mask stage drive 310 and the wafer stage drive 314 to align the wafer and the reticle, respectively, such that the alignment mark on the wafer and the alignment mark on the reticle can be precisely aligned. After the alignment, the controller 320 may also control an exposure process to expose the wafer with the mask pattern on the reticle.

The controller 320 may include a process of any appropriate type, such as a general purpose microprocessor, a digital signal processor (DSP) or microcontroller, or an application specific integrated circuit (ASIC). The controller 320 may also include other components, such as memory or other storage modules for storing computer programs and data, communication interfaces for connecting with other applications and systems, input/output interfaces for a user to input information into the exposure system 300 or for the user to receive information from the exposure system 300, and/or a display unit for displaying information to the user, etc.

Figure 2:
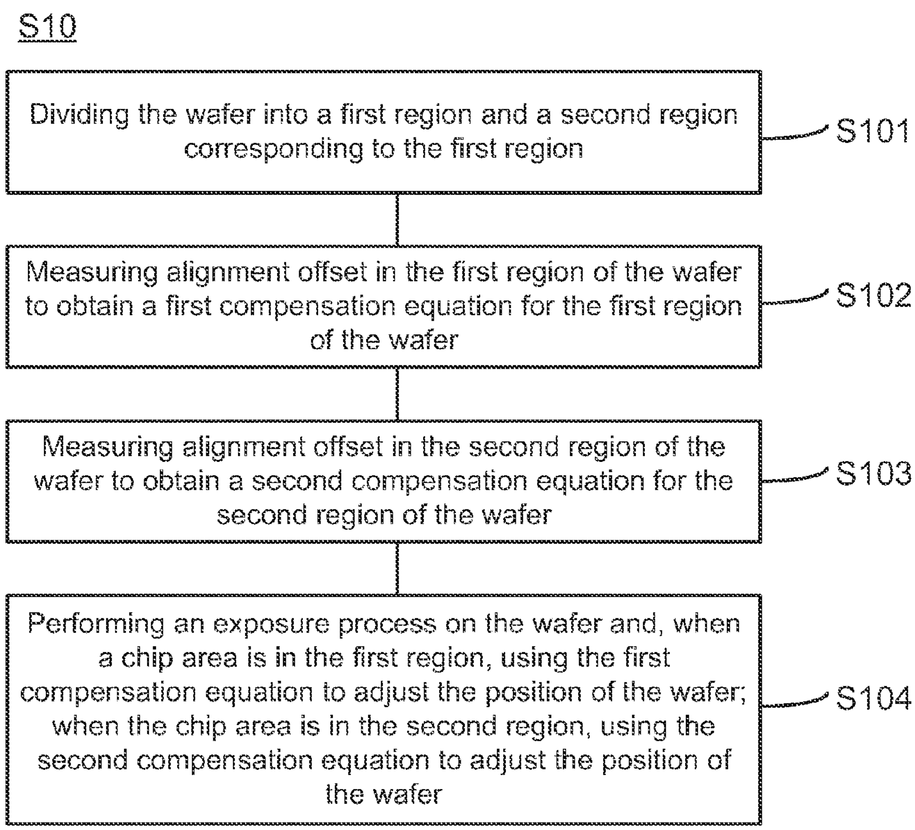
FIG. 2 illustrates an exemplary operation process consistent with the disclosed embodiments.

In operation, the processor of the controller 320 may execute sequences of computer program instructions in the memory to perform various processes associated with exposure system 300. FIG. 2 illustrates an exemplary operation process S10 consistent with the disclosed embodiments.

Figure 3:
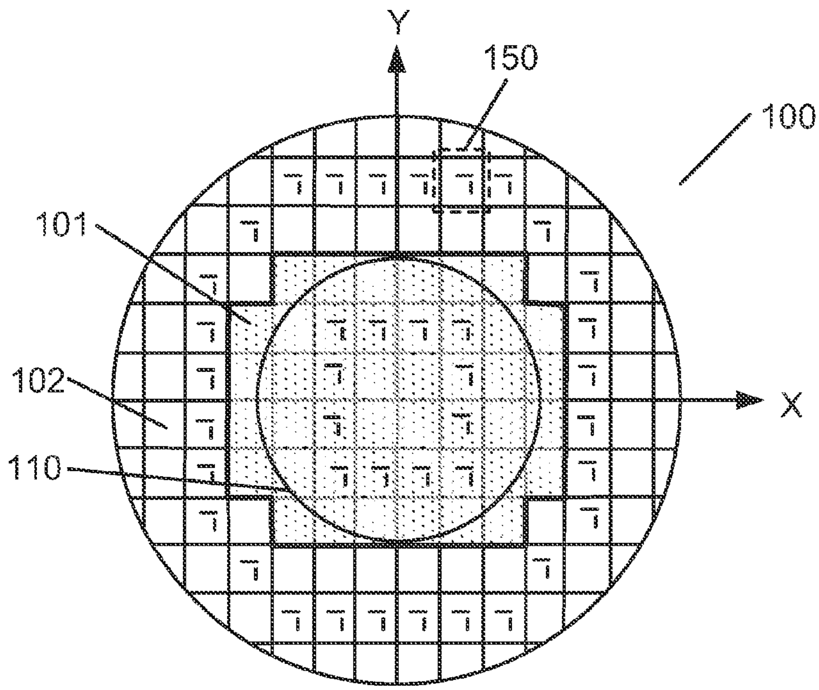
FIG. 3 illustrates exemplary divided regions of a wafer with consistent with the disclosed embodiments.

As shown in FIG. 2, at the beginning of the process S10, the surface of the wafer to be exposed is divided into a first region and a second region corresponding to the first region (S101). FIG. 3 shows an exemplary wafer 100 with divided regions.

As shown in FIG. 3, the wafer 100 is divided into a first region 101 and a second region 102 corresponding to the first region 101. When there is one or more semiconductor layers already formed on the surface of wafer 100, stress may exist between the semiconductor layers due to high-temperature in the processes forming the semiconductor layers. Such stress may cause warpage or deformation of the wafer 100, and such wafer warpage or deformation may be different in different regions of the wafer 100. For example, such wafer warpage or deformation may be larger at the outer regions (e.g., close to edge) of the wafer 100 than at the center region of the wafer 100.

In certain embodiments, the first region 101 may include areas near the center of the wafer 100, and the second region 102 may include areas close to the edge of the wafer 100. The boundary between the first region 101 and the second region 102 may be located within a ring having an inner radius of approximately 30% of the radius of the wafer 100 and an outer radius of approximately 80% of the radius of the wafer 100. Other configurations may also be used.

The wafer 100 may include a plurality of chip areas 150 arranged in a matrix format or other format. Each chip area may form an individual chip after various semiconductor processes, and each chip area may be of a shape of a rectangle, a square, or other geometric shape. The plurality of chip areas 150 are isolated by horizontal and/or vertical scribe lines (not shown), where the alignment marks for the individual chip areas may be placed.

Thus, the first region 101 may include a plurality of chip areas 150 totally or partially within a boundary circle, and the second region 102 may include a plurality of chip areas 150 totally outside the boundary circle. In other words, the real boundary between the first region 101 and the second region 102 may be a polygon around the contours of the chip areas totally or partially in the boundary circle, instead of a perfect circle. Because, during the exposure process, only one or several chip areas are exposed at a time, it may take multiple times of alignments and exposures to expose the entire wafer 100.

In certain embodiments, the boundary circle between the first region 101 and the second region 102 may be a boundary circle 110 having a radius of 50% of the radius of the wafer 100 from the center of the wafer 100. That is, the first region 101 includes chip areas completely located inside the concentric boundary circle 110 and chips areas partially located inside the boundary circle 110, while the second region 102 includes chip areas located entirely outside the boundary circle 110.

Because the wafer 100 may have different wafer warpage and/or stress in the first region 101 and second region 102, the alignment offset between the wafer alignment mark and the reticle alignment mark may be determined separately and independently in the different regions, and the different alignment offsets in the different regions may be adjusted using separate and/or different adjustment algorithms or equations such that desired alignment precision can be achieved in both the first region 101 and the second region 102, respectively.

Although a boundary circle is used between the first region 101 and the second region 102, other boundary shapes, such as polygon, oval, and other geometric shapes, may also be used. In certain embodiments, the wafer 100 may be divided into a plurality of regions based on degrees of the wafer warpage and/or stress of different regions of the wafer 100. Alignment offsets may then be determined for the plurality of regions and individual alignment compensation algorithms and/or equations may be determined for the corresponding regions, such that the plurality of regions can have desired alignment precision.

More particularly, before the exposure process is performed, based on a single wafer or multiple wafers from a batch of wafers in fabrication, alignment offsets are measured in different locations of the single wafer or multiple wafers to determine the alignment offsets in these different locations. Based on the alignment offsets from different locations, the degrees of wafer warpage over the entire wafer may be determined. Further, based on the various degrees of wafer warpage, the wafer 100 can be divided into plurality of regions for the exposure process.

Alternatively or additionally, stress at the different locations of the single wafer or multiple wafers are measured. The degrees of wafer warpage over the entire wafer may be determined based on the stress values at the different locations.

Figure 4:
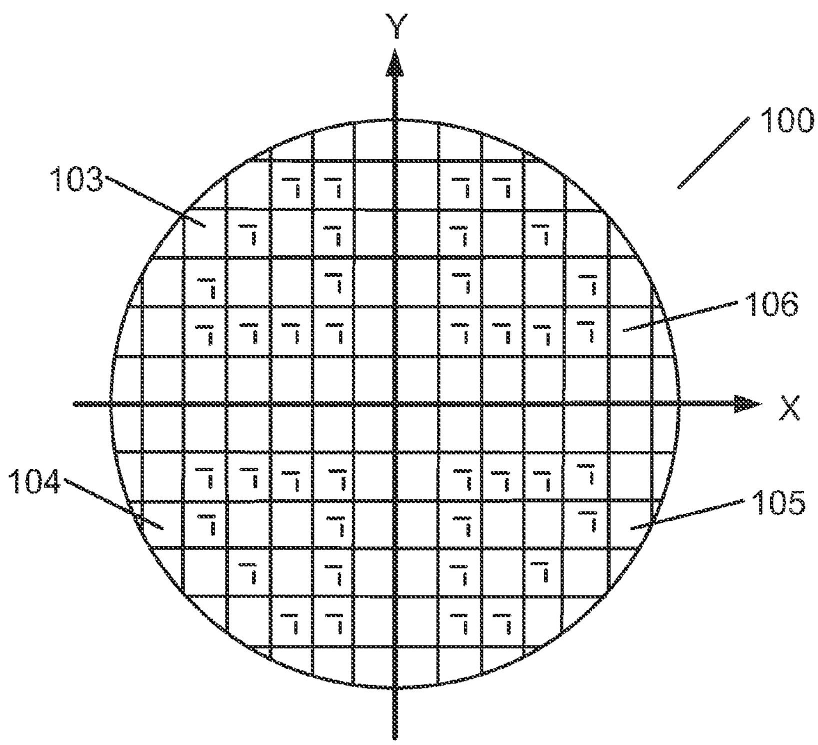
FIG. 4 illustrates exemplary divided regions of a wafer with consistent with the disclosed embodiments.

In certain other embodiments, the wafer 100 may be divided into a number of circular sectors. Alignment offsets of the circular sectors are separately measured for the different circular sectors, and individual alignment compensation equations or algorithms may be determined for the individual circular sectors based on the measured alignment offsets such that each circular sector may have desired alignment precision. Any number of circular sectors may be used. For example, at least two circular sectors may be used, and the shapes and sizes of the circular sectors may be the same or may be different. FIG. 4 shows an exemplary wafer exposure region division.

As shown in FIG. 4, wafer 100 is divided into four circular sectors 103, 104, 105, and 106. Each circular sector 103, 104, 105, or 106 has the same shape and size, which allows desired alignment accuracy in different exposure regions on the wafer 100 in different directions.

Figure 5:
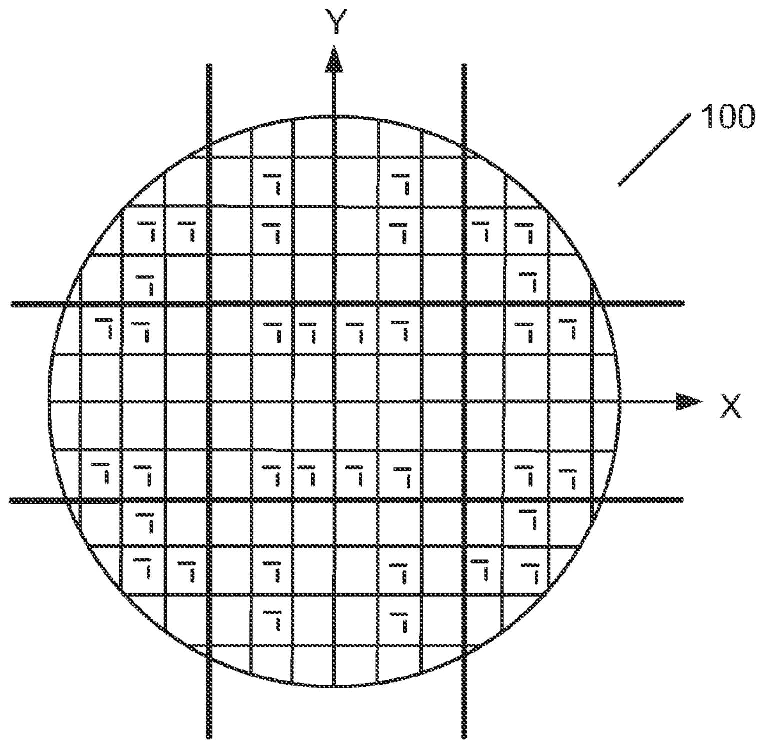
FIG. 5 illustrates exemplary divided regions of a wafer with consistent with the disclosed embodiments.

FIG. 5 shows another exemplary wafer exposure region division. As shown in FIG. 5, the wafer 100 is divided into a plurality of rectangular regions (not numbered). The plurality of rectangular regions are arranged in a matrix or a grid formation. Alignment offsets of the rectangular regions are separately measured for the different rectangular regions, and individual alignment compensation equations or algorithms may be determined for the individual rectangular regions based on the measured alignment offsets such that each rectangular region may have desired alignment precision.

Figure 6:
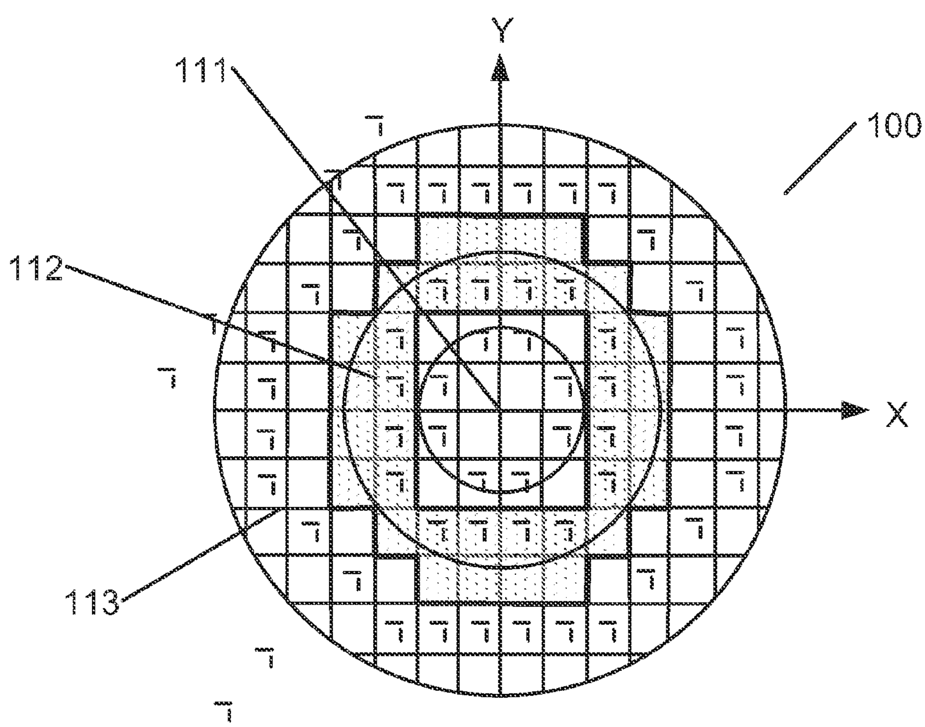
FIG. 6 illustrates exemplary divided regions of a wafer with consistent with the disclosed embodiments.

In certain other embodiment, the wafer 100 may be divided into a circular region and at least one concentric ring regions. FIG. 6 shows an example of such wafer exposure region division. As shown in FIG. 6, the wafer 100 is divided into a circular region 111, a first concentric ring region 112, and a second concentric ring region 113. Alignment offsets of the circular region 111 and the concentric ring regions 112 and 113 are separately measured, and individual alignment compensation equations or algorithms may be determined for the individual regions based on the measured alignment offsets such that the circular region 111 and each of the concentric ring regions 112 and 113 may have desired alignment precision.

Returning to FIG. 2, after the wafer exposure regions are divided (S101), alignment offsets are measured for the first region 101 of wafer 100 to determine a first alignment compensation equation for the first region 101 of the wafer 100 (S102).

Using the wafer 100 shown in FIG. 3 as an example, a plurality of chip areas 150 (e.g., marked by 'ㄱ') may be selected within the first region 101 of the wafer 100. The plurality of chip areas may be selected randomly or may be selected geographically to cover the first region 101 evenly. At least 3 chip areas not located on a straight line may need to be selected.

After the chip areas 150 are selected, the alignment offset of each chip area 150 is measured and recorded. That is, the alignment mark detection system 312 is used to measure the alignment offset between the alignment mark on wafer 100 and the alignment mark on the reticle when a specific chip area or areas is aligned for exposure. Further, based on the alignment offsets obtained for the selected chip areas 150, the first alignment compensation equation for the first region 101 may be determined.

In certain embodiments, a total of 18 or 36 chip areas 150 may be selected. The 18 or 36 chip areas may be evenly distributed along a circle concentric with the wafer 100 or may be evenly distributed along a regular polygon concentric with the wafer 100. The first alignment compensation equation for the first region 101 may be determined based on the alignment offsets obtained for the selected 18 or 36 chip areas 150.

The alignment compensation equation may be a function with various alignment compensation parameters. For example, an alignment compensation equation may be represented as:

$$A_1[Tx,Ty,Ex,Ey,Rx,Ry],$$

where $A_1$ represents the alignment compensation for the first region 101, (Tx, Ty) represent compensation from lateral shift caused by the wafer warpage of the wafer 100 along X-axis and Y-axis, (Ex, Ey) represent compensation from pattern image amplification changes caused by the wafer warpage of wafer 100 in Z-axis, and (Rx, Ry) represent compensation from rotation caused by the wafer warpage of wafer 100. Other equations may also be used.

More specifically, the center of the wafer 100 may be used as the origin point of (X, Y) coordinate system of the cross-section plane of the wafer 100, and each chip area has coordinates based on the X-axis and Y-axis. The Z-axis is the direction from the wafer 100 to the mask or reticle. The alignment compensation equation can then be determined according to various alignment shift compensations.

Figure 7:
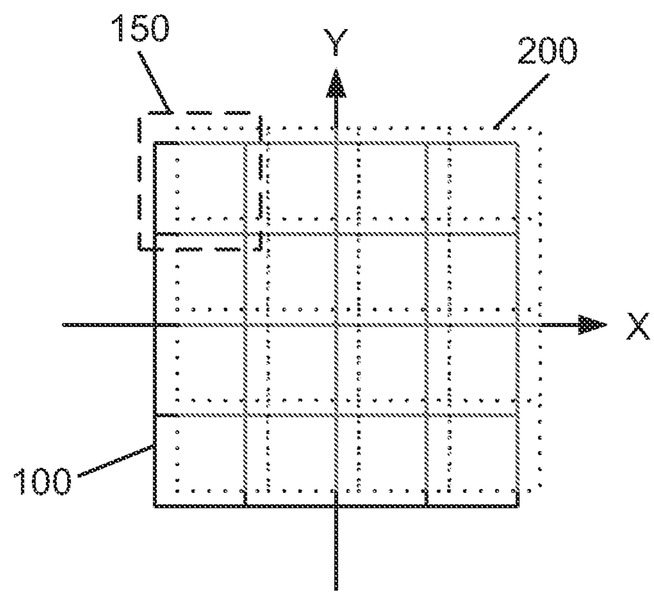
FIG. 7 illustrates an exemplary lateral shift and compensation calculation of a wafer consistent with the disclosed embodiments.

FIG. 7 illustrates alignment compensation from lateral shift. As shown in FIG. 7, because of the wafer warpage, the wafer 100 is shifted within the (X, Y) plane with respect to the mask pattern 200. Such alignment offsets need to be compensated using first lateral shift equation:

$$Tx=k1,\ \text{and}\ Ty=k2,$$

where k1 is first coefficient for the shift along the X-axis, and k2 is second coefficient for the shift along the Y-axis. That is, when a chip area 150 has an X-coordinate 'x', and a Y-axis coordinate 'y', Tx is the X-axis alignment compensation for wafer 100, and Ty is the Y-axis alignment compensation for wafer 100. Further, k1 and/or k2 may be determined based on an average or weighted average of the alignment offsets measured for all selected chip areas 150 in the first region 101.

Figure 8:
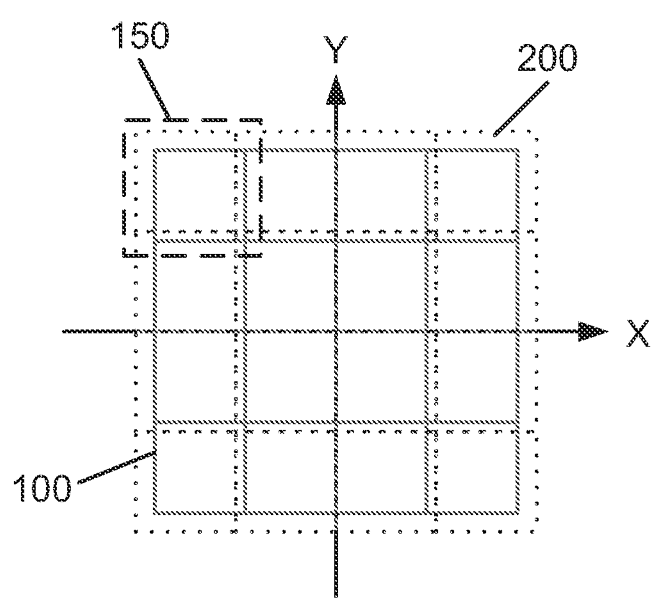
FIG. 8 illustrates an exemplary distance shift and compensation calculation of a wafer consistent with the disclosed embodiments.

FIG. 8 illustrates alignment compensation from distance shift. As shown in FIG. 8, because of the wafer warpage, the wafer 100 is shifted along the vertical (Z-axis) with respect to the mask or reticle such that the distance between the wafer 100 and the mask or reticle is increased or decreased, and the mask pattern 200 is amplified larger or smaller than the wafer pattern of the chip areas 150 when projected onto the wafer 100. The distance shift may be compensated by first distance shift equation:

$$Ex=k3*x, \text{ and } Ey=k4*y,$$

where, when the chip area has an X-coordinate 'x', and a Y-axis coordinate 'y', Ex is the X-axis alignment compensation for wafer 100, and Ey is the Y-axis alignment compensation for wafer 100, k3 is the third coefficient for X-direction amplification shift, and k4 is the fourth coefficient for Y-direction amplification shift. Further, k3 and/or k4 may be determined based on an average or weighted average of the alignment offsets measured for all selected chip areas 150 in the first region 101.

Figure 9:
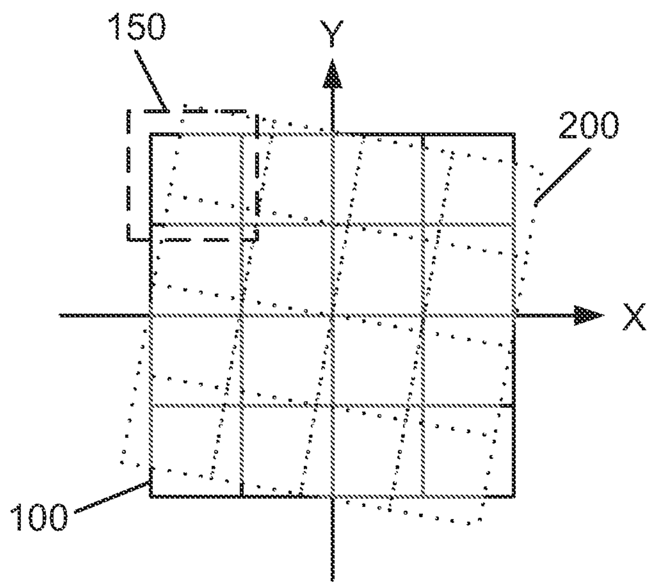
FIG. 9 illustrates an exemplary rotation and compensation calculation of a wafer consistent with the disclosed embodiments.

FIG. 9 illustrates alignment compensation from rotation. As shown in FIG. 9, because of the wafer warpage, the wafer 100 is rotated with respect to the mask pattern 200. The rotation may be compensated by first rotation equation:

$$Rx=k5*y, \text{ and } Ry=k6*x,$$

where, when the chip area has an X-coordinate 'x', and a Y-axis coordinate 'y', Rx is the X-axis alignment compensation for wafer 100 due to rotation, and Ry is the Y-axis alignment compensation for wafer 100 due to rotation, k5 is the fifth coefficient for X-direction rotation, and k6 is the sixth coefficient for Y-direction rotation. Further, k5 and/or k6 may be determined based on an average or weighted average of the alignment offsets measured for all selected chip areas 150 in the first region 101.

In practice, the wafer warpage on the wafer 100 may cause one or more types of lateral shift, distance shift, and rotation. For the plurality of selected chip areas 150, the alignment mark in each chip area 150 may be used to measure the alignment offset against the alignment mark on the reticle or mask. The alignment offsets of these selected chip areas 150 may then be used determine the six coefficients k1-k6, and the first compensation equation (i.e., the first lateral shift equation, the first distance shift equation, and the first rotation equation) can then be determined.

Returning to FIG. 2, after the first alignment compensation equation for the first region 101 is determined (S102), alignment offsets are measured for the second region 102 of wafer 100 to determine a second alignment compensation equation for the second region 102 of the wafer 100 (S103).

The second alignment compensation equation may be represented as:

$$A_2[Tx,Ty,Ex,Ey,Rx,Ry],$$

where $A_2$ represents the alignment compensation for the second region 102, (Tx, Ty) represent compensation from shift caused by the wafer warpage of the wafer 100 along X-axis and Y-axis, (Ex, Ey) represent compensation from pattern image amplification changes caused by the wafer warpage of wafer 100 in Z-axis, and (Rx, Ry) represent compensation from rotation caused by the wafer warpage of wafer 100. Other equations may also be used.

Similar to the first compensation equation described above, lateral alignment offsets need to be compensated using a second lateral shift equation:

$$Tx=c1, \text{ and } Ty=c2,$$

where c1 is first coefficient for the shift along the X-axis, and c2 is second coefficient for the shift along the Y-axis.

The amplification shift may be compensated by second amplification shift equation:

$$Ex=c3*x, \text{ and } Ey=c4*y,$$

where, when the chip area has an X-coordinate 'x', and a Y-axis coordinate 'y', Ex is the X-axis alignment compensation for wafer 100, and Ey is the Y-axis alignment compensation for wafer 100, c3 is the third coefficient for X-direction distance shift, and c4 is the fourth coefficient for Y-direction distance shift.

Further, the rotation may be compensated by second rotation equation:

$$Rx=c5*y, \text{ and } Ry=c6*x,$$

where, when the chip area has an X-coordinate 'x', and a Y-axis coordinate 'y', Rx is the X-axis alignment compensation for wafer 100 due to rotation, and Ry is the Y-axis alignment compensation for wafer 100 due to rotation, c5 is the fifth coefficient for X-direction rotation, and c6 is the sixth coefficient for Y-direction rotation.

For the plurality of selected chip areas 150 in the second region 102, the alignment mark in each chip area 150 may be used to measure the alignment offset against the alignment mark on the reticle or mask. The alignment offsets of these selected chip areas 150 in the second region 102 may then be used determine the six coefficients c1-c6, and the second compensation equation can then be determined.

Thus, the first region 101 and the second region 102 each has independent coefficients and compensation equations to compensate alignment offsets in the first region 101 and the second region 102, respectively. The alignment accuracy for both the first region 101 and the second region 102 can be improved. Further, if wafer 100 is divided into more than the first region 101 and the second region 102, additional compensation equations may also be determined similarly.

Returning to FIG. 2, after determining alignment compensation equations for all divided regions, alignment of the wafer 100 is adjusted based on the regions and the corresponding compensation equations to perform the exposure process on the wafer 100 (S104).

That is, the controller 320 may determine whether a chip area or areas is in the first region 101 or the second region 102. When the chip area is in the first region 101, controller 320 uses the first compensation equation to adjust the alignment of wafer 100 such that the alignment accuracy for the chip area in the first region 101 is desired, and when the chip area is in the second region 102, controller 320 uses the second compensation equation to adjust the alignment of wafer 100 such that the alignment accuracy for the chip area in the second region 102 is desired.

More specifically, when the chip area is in the first region 101, controller 320 may use the coordinates of the chip area and the determined coefficients k1-k6 to calculate various compensation parameters using the first compensation equation. Based on the calculated various compensations (e.g., Tx, Ty, Ex, Ey, Rx, Ry), the controller 320 may control the mask stage drive 310 and/or wafer stage drive 314 based on the various compensation parameters to align the mask and the wafer 100. Further, the chip area or areas are exposed using the mask pattern on the mask or reticle.

On the other hand, when the chip area is in the second region 102, controller 320 may use the coordinates of the chip area and the determined coefficients c1-c6 to calculate various compensation parameters using the second compensation equation. Based on the calculated various compensations (e.g., Tx, Ty, Ex, Ey, Rx, Ry), the controller 320 may control the mask stage drive 310 and/or wafer stage drive 314 based on the various compensation parameters to align the mask and the wafer 100. Further, the chip area or areas are exposed using the mask pattern on the mask or reticle.

Because the compensation equations are predetermined before the exposure process is performed, using different compensation equations does not add significant time overhead. However, the alignment accuracy of different regions on wafer 100 may be significantly improved by using different compensation equations.

By using the disclosed methods and systems, high precision mask pattern alignment applications can be implemented. The wafer to be exposed is divided into a plurality of regions, and alignment offsets are measured for the plurality of regions to obtain corresponding alignment compensation equations for the plurality of regions. During the exposure process, the alignment between the mask and wafer can be adjusted based on the alignment compensation equations for corresponding regions. Thus, the alignment accuracy can be significantly improved.

Other applications, advantages, alternations, modifications, or equivalents to the disclosed embodiments are obvious to those skilled in the art.

What is claimed is:

1. A method for aligning a mask with a wafer for exposing the wafer with a mask pattern in the mask, comprising:

dividing the wafer into a plurality of regions including a first region and a second region different from the first region, each region containing a plurality of chip areas;

obtaining alignment offset values for the first region;

determining a first alignment compensation equation for the first region based on the alignment offset values for the first region, wherein:

the first alignment compensation equation is represented as: A1[Tx, Ty, Ex, Ey, Rx, Ry], A1 represents an alignment compensation for the first region, (Tx, Ty) represents a compensation from a lateral shift caused by a wafer warpage of the wafer along X-axis and Y-axis, (Ex, Ey) represents a compensation from pattern image amplification changes caused by the wafer warpage of the wafer in Z-axis, and (Rx, Rv) represents a compensation from a rotation caused by the wafer warpage of the wafer, Tx is X-axis lateral shift compensation, Ty is Y-axis lateral shift compensation, k1 and k2 are coefficients, the compensation equation for lateral shift is: Tx=k1, and Ty=k2, the chip area has an X-coordinate 'x', and a Y-axis coordinate 'y', Ex is X-axis distance shift compensation, Ey is Y-axis distance shift compensation, k3 and k4 are coefficients, the compensation equation for distance shift is: Ex=k3*x, and Ey=k4*y, the chip area has an X-coordinate 'x', and a Y-axis coordinate 'y', Rx is X-axis rotation compensation, Ry is Y-axis rotation compensation, k5 and k6 are coefficients, the compensation equation for lateral shift is: Rx=k5*y, and Ry=k6*x, and the one or more of k1, k2, k3, k4, k5, and k6 are determined, based on an average or weighted average of corresponding alignment offsets measured from chip areas selected from the plurality of chip areas in the first region;

obtaining alignment offset values for the second region;

determining a second alignment compensation equation for the second region based on the alignment offset values for the second region;

determining whether a chip area to be exposed is in the first region or the second region;

when the chip area is in the first region, using the first alignment compensation equation to adjust alignment of the wafer; and when the chip area is in the second region, using the second alignment compensation equation to adjust the alignment of the wafer.

2. The method according to claim 1, further including:

performing an exposure process on the chip area after adjusting the alignment of the wafer.

3. The method according to claim 1, wherein:

the plurality of the regions are divided based on degrees of wafer warpage.

4. The method according to claim 1, wherein:

the first region is close to a center of the wafer; and the second region is close to an edge of the wafer.

5. The method according to claim 1, wherein:

a boundary circle separating the first region and the second region is concentric with the wafer and located within a ring having an inner radius of 30% of a radius of the wafer and an outer radius of 80% of the radius of the wafer.

6. The method according to claim 1, wherein:

the plurality of regions are circular sectors of the wafer.

7. The method according to claim 1, wherein:

the plurality of regions are rectangular shapes and arranged in a matrix format.

8. The method according to claim 1, wherein:

the plurality of regions include a circle concentric with the wafer and at least a concentric ring around the circle.

9. An exposure system, comprising:

an illumination unit for providing a light source;

a mask stage configured to hold at least one mask containing a mask pattern;

a mask stage drive configured to align the mask stage;

a wafer stage configured to hold at least one wafer;

a wafer stage drive configured to align the wafer stage;

an optical projection unit disposed between the mask stage and the wafer stage to expose the mask pattern on the wafer; and a controller configured to: divide the wafer into a plurality of regions including a first region and a second region different from the first region, each region containing a plurality chip areas;

obtain alignment offset values for the first region;

determining a first alignment compensation equation for the first region based on the alignment offset values for the first region, wherein:

the first alignment compensation equation is represented as: A1[Tx, Ty, Ex, Ey, Rx, Ry], A1 represents an alignment compensation for the first region, (Tx, Ty) represents a compensation from a lateral shift caused by a wafer warpage of the wafer along X-axis and Y-axis, (Ex, Ey) represents a compensation from pattern image amplification changes caused by the wafer warpage of the wafer in Z-axis, and (Rx, Rv) represents a compensation from a rotation caused by the wafer warpage of the wafer, Tx is X-axis lateral shift compensation, Ty is Y-axis lateral shift compensation, k1 and k2 are coefficients, the compensation equation for lateral shift is: Tx=k1, and Ty=k2, the chip area has an X-coordinate 'x', and a Y-axis coordinate 'y', Ex is X-axis distance shift compensation, Ey is Y-axis distance shift compensation, k3 and k4 are coefficients, the compensation equation for distance shift is: Ex=k3*x, and Ey=k4*y, the chip area has an X-coordinate 'x', and a Y-axis coordinate 'y', Rx is X-axis rotation compensation, Ry is Y-axis rotation compensation, k5 and k6 are coefficients, the compensation equation for lateral shift is: Rx=k5*y, and Ry=k6*x, and the one or more of k1, k2, k3, k4, k5, and k6 are determined, based on an average or weighted average of corresponding alignment offsets measured from chip areas selected from the plurality of chip areas in the first region;

obtain alignment offset values for the second region;

determine a second alignment compensation equation for the second region based on the alignment offset values for the second region;

determine whether a chip area to be exposed is in the first region or the second region;

when the chip area is in the first region, use the first alignment compensation equation to control at least one of the wafer stage drive and the mask stage drive to adjust alignment of the wafer with the mask; and when the chip area is in the second region, using the second alignment compensation equation to control at least one of the wafer stage drive and the mask stage drive to adjust the alignment of the wafer with the mask.

10. The exposure system according to claim 9, wherein the controller is further configured to: perform an exposure process on the chip area after adjusting the alignment of the wafer.

11. The exposure system according to claim 9, wherein: the plurality of the regions are divided based on degrees of the wafer warpage.

12. The exposure system according to claim 9, wherein: the first region is close to a center of the wafer; and the second region is close to an edge of the wafer.

13. The exposure system according to claim 9, wherein: a boundary circle separating the first region and the second region is concentric with the wafer and located within a ring having an inner radius of 30% of a radius of the wafer and an outer radius of 80% of the radius of the wafer.

14. The exposure system according to claim 9, wherein: the plurality of regions are circular sectors of the wafer.

15. The exposure system according to claim 9, wherein: the plurality of regions are rectangular shapes and arranged in a matrix format.

* * * * *